United States Patent
Park et al.

(10) Patent No.: US 11,581,382 B2
(45) Date of Patent: Feb. 14, 2023

(54) DISPLAY DEVICE AND CAPACITOR PLATES INCLUDING DIFFERENT SIZE HOLES

(71) Applicant: Samsung Display Co., Ltd., Yongin-si (KR)

(72) Inventors: Junhyun Park, Yongin-si (KR); Minjae Jeong, Yongin-si (KR); Junki Jeong, Yongin-si (KR); Jaehyung Cho, Yongin-si (KR); Seonyoung Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 128 days.

(21) Appl. No.: 17/088,049

(22) Filed: Nov. 3, 2020

(65) Prior Publication Data
US 2021/0327988 A1   Oct. 21, 2021

(30) Foreign Application Priority Data
Apr. 16, 2020   (KR) .......................... 10-2020-0046263

(51) Int. Cl.
*H01L 29/12* (2006.01)
*H01L 27/32* (2006.01)
*G09G 3/3233* (2016.01)

(52) U.S. Cl.
CPC ...... *H01L 27/3265* (2013.01); *H01L 27/3276* (2013.01); *G09G 3/3233* (2013.01);
(Continued)

(58) Field of Classification Search
CPC ............ H01L 27/3265; H01L 27/3276; G09G 3/3233; G09G 2300/0426
(Continued)

(56) References Cited

U.S. PATENT DOCUMENTS 8,462,086 B2   6/2013   Takasugi et al.
10,622,436 B2   4/2020   Park et al.
(Continued)

FOREIGN PATENT DOCUMENTS

KR   10-1056233   8/2011
KR   10-1351416   1/2014
(Continued)

*Primary Examiner* — Phuc T Dang
(74) *Attorney, Agent, or Firm* — Kile Park Reed & Houtteman PLLC

(57) ABSTRACT

A display device includes a scan line extending in a direction, a data line and a driving voltage line extending in another direction, a transistor electrically connected to the driving voltage line and including a first gate electrode and a first semiconductor layer, a second transistor electrically connected to the scan and data lines and including a second gate electrode and a second semiconductor layer, a first capacitor electrically connected to the first transistor and including first and second capacitor plates, and a second capacitor including a third capacitor plate electrically connected to the first transistor and a fourth capacitor plate electrically connected to the second transistor. The second capacitor plate includes a first hole overlapping the first capacitor plate, the fourth capacitor plate includes a second hole overlapping the third capacitor plate, and a size of the second hole is different from that of the first hole.

22 Claims, 11 Drawing Sheets

(52) U.S. Cl.
CPC ............... *G09G 2300/0426* (2013.01); *G09G 2300/0819* (2013.01); *G09G 2320/0233* (2013.01); *G09G 2320/0252* (2013.01)

(58) Field of Classification Search
USPC ........................................................ 257/71
See application file for complete search history.

(56) References Cited

U.S. PATENT DOCUMENTS

| | | | |
|---|---|---|---|
| 2006/0170023 A1* | 8/2006 | Nikaido | H01L 27/11 257/E27.098 |
| 2009/0174984 A1* | 7/2009 | Tachibana | H01L 27/11507 361/306.1 |
| 2010/0073586 A1* | 3/2010 | Chen | G02F 1/13624 257/E27.06 |
| 2011/0227893 A1 | 9/2011 | Bae et al. | |
| 2014/0098078 A1* | 4/2014 | Jeon | H01L 27/3276 345/82 |
| 2014/0117328 A1* | 5/2014 | Hur | H01L 27/1255 257/40 |
| 2014/0320544 A1 | 10/2014 | Kim | |
| 2019/0237494 A1* | 8/2019 | Bae | H01L 27/3262 |
| 2019/0393291 A1 | 12/2019 | Jeon et al. | |
| 2020/0006401 A1 | 1/2020 | Hwang et al. | |
| 2020/0135091 A1* | 4/2020 | Kim | G09G 3/3233 |

FOREIGN PATENT DOCUMENTS

| | | |
|---|---|---|
| KR | 10-2019-0056465 | 5/2019 |
| KR | 10-2029-0000853 | 1/2020 |

\* cited by examiner

DISPLAY DEVICE AND CAPACITOR PLATES INCLUDING DIFFERENT SIZE HOLES

CROSS-REFERENCE TO RELATED APPLICATION(S)

This application claims priority to and benefits of Korean Patent Application No. 10-2020-0046263 under 35 U.S.C. § 119, filed on Apr. 16, 2020, in the Korean Intellectual Property Office, the entire contents of which are incorporated herein by reference.

BACKGROUND

1. Technical Field

One or more embodiments relate to a display device.

2. Description of the Related Art

In general, display devices may include a display element and electronic elements for controlling an electrical signal applied to the display element. The electronic elements may include transistors and capacitors.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

With the development of various electronic devices having display devices, there is a demand for development of pixel circuits suitable for high-speed driving and/or capable of providing high-quality images.

One or more embodiments may include a display device including a pixel circuit suitable for high-speed driving, for example, high-speed driving of about 120 Hz or more. In addition or alternatively, one or more embodiments may include a display device that may display high-quality images by preventing or minimizing the generation of spots due to luminance changes during high-speed driving.

It should be understood that embodiments described herein should be considered in a descriptive sense only and not for limitation of the presented embodiments.

Additional aspects will be set forth in part in the description which follows and, in part, will be apparent from the description, or may be learned by practice of the presented embodiments.

According to one or more embodiments, a display device may include a scan line extending in a first direction, a data line and a driving voltage line each extending in a second direction, a first transistor electrically connected to the driving voltage line and including a first gate electrode and a first semiconductor layer, a second transistor electrically connected to the data line and the scan line and including a second gate electrode and a second semiconductor layer, a first capacitor electrically connected to the first transistor and including a first capacitor plate and a second capacitor plate, and a second capacitor including a third capacitor plate electrically connected to the first transistor, and a fourth capacitor plate electrically connected to the second transistor, wherein the second capacitor plate may include a first hole overlapping the first capacitor plate, the fourth capacitor plate may include a second hole overlapping the third capacitor plate, and a size of the second hole may be different from a size of the first hole.

The size of the second hole of the fourth capacitor plate may be greater than the size of the first hole of the second capacitor plate.

The third capacitor plate may include an isolated pattern.

The display device may further include a first connection line electrically connecting the third capacitor plate and the first transistor, wherein the first connection line may be electrically connected to the third capacitor plate through the second hole of the fourth capacitor plate.

The third capacitor plate may be electrically connected to one of a source region and a drain region of the first semiconductor layer of the first transistor, and the fourth capacitor plate may be electrically connected to one of a source region and a drain region of the second semiconductor layer of the second transistor.

The fourth capacitor plate may include an isolated pattern.

The display device may further include a second connection line electrically connecting the fourth capacitor plate and the second transistor.

The first capacitor plate may include an isolated pattern.

The display device may further include a third transistor electrically connected to the first transistor, and a third connection line electrically connecting the first capacitor and the third transistor.

The third connection line may be electrically connected to the first capacitor plate through the first hole of the second capacitor plate.

The first capacitor plate may include the first gate electrode of the first transistor.

The display device may further include a fourth transistor electrically connected to the second capacitor and the second transistor, and a reference voltage line extending in the second direction and electrically connected to the fourth transistor.

According to one or more embodiments, a display device may include a scan line extending in a first direction, a data line and a driving voltage line each extending in a second direction, a first transistor electrically connected to the driving voltage line and including a first gate electrode and a first semiconductor layer, a first capacitor electrically connected to the first transistor and including a first capacitor plate and a second capacitor plate, a second transistor electrically connected to the data line and the scan line and including a second gate electrode and a second semiconductor layer, and a second capacitor electrically connected to the first transistor and the second transistor and including a third capacitor plate and a fourth capacitor plate, wherein the first capacitor and the second capacitor may be spaced apart from each other, the second capacitor plate may include a first hole overlapping the first capacitor plate, the fourth capacitor plate may include a second hole overlapping the third capacitor plate, and a size of the second hole may be different from a size of the first hole.

The size of the second hole of the fourth capacitor plate may be greater than the size of the first hole of the second capacitor plate.

The third capacitor plate may be electrically connected to one of a source region and a drain region of the first semiconductor layer of the first transistor, and the fourth capacitor plate may be electrically connected to one of a source region and a drain region of the second semiconductor layer of the second transistor.

The display device may further include a first connection line electrically connecting the second capacitor and the first transistor, wherein the first connection line may be electrically connected to the third capacitor plate through the second hole of the fourth capacitor plate.

The third capacitor plate may include an isolated pattern.

The display device may further include a second connection line electrically connecting the fourth capacitor plate of the second capacitor and the second transistor.

The display device may further include a third transistor electrically connected to the first transistor, and a third connection line electrically connecting the first capacitor and the third transistor, wherein the third connection line may be electrically connected to the first capacitor plate through the first hole of the second capacitor plate.

The first capacitor plate may include an isolated pattern.

The first capacitor plate may include the first gate electrode of the first transistor.

The display device may further include a fourth transistor electrically connected to the second capacitor and the second transistor, and a reference voltage line extending in the second direction and electrically connected to the fourth transistor.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
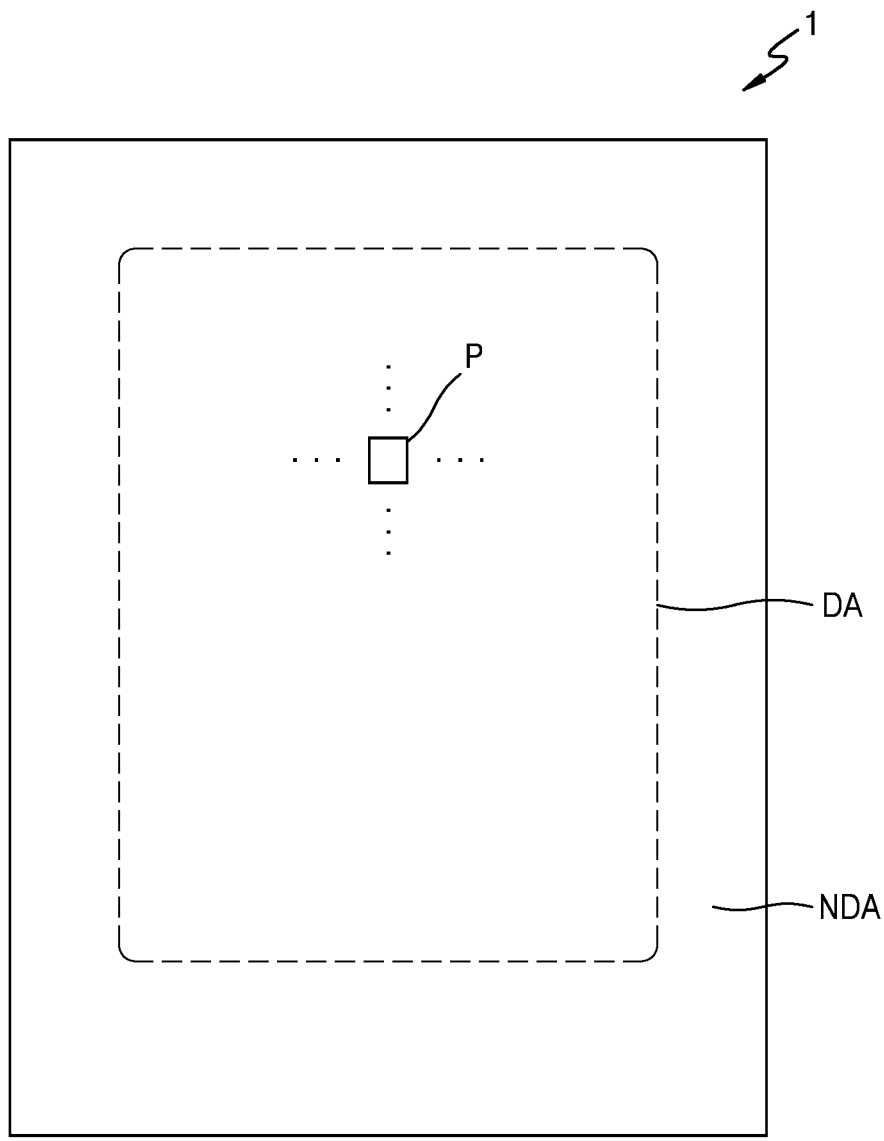
FIG. 1 is a schematic plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A or B" may be understood to mean "A, B, or A and B."

Because various modifications may be applied and one or more embodiments may be implemented, embodiments will be shown in the drawings and described in detail in the detailed description. Effects and features of the disclosure and methods of achieving the same will be apparent with reference to the embodiments described below in detail with the accompanying drawings. However, the disclosure is not limited to the embodiments disclosed below and may be implemented in various forms.

Hereinafter, embodiments are described in detail with reference to the accompanying drawings. When description is made with reference to the drawings, like reference numerals are used for like or corresponding elements and repeated descriptions thereof are omitted.

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

It will be understood that when a layer, region, or element is referred to as being "formed on," another layer, region, or element, it can be directly or indirectly formed on the other layer, region, or element. That is, for example, intervening layers, regions, or element may be present. Sizes of elements in the drawings may be exaggerated or reduced for convenience of explanation. In other words, since sizes and thicknesses of elements in the drawings are arbitrarily illustrated for convenience of explanation, the following embodiments are not limited thereto. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or element is referred to as being "connected" to another layer, region, or element, it may be "directly connected" to the other layer, region, element and/or may be "indirectly connected" to the other layer, region, or element with other layer, region, or element therebetween. For example, it will be understood that when a layer, region, or element is referred to as being "electrically connected" to another layer, region, or element, it may be "directly electrically connected" to the other layer, region, or element and/or may be "indirectly electrically connected" to other layer, region, or element with other layer, region, or element therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic plan view of a display device 1 according to an embodiment.

Referring to FIG. 1, the display device 1 may include a display area DA and a non-display area NDA around the display area DA. The display area DA may provide an image by using light emitted from pixels P. Each of the pixels P may include a display element that may emit light (for example, red, green, and blue light).

The non-display area NDA, which may be an area in which the pixels P may not be arranged or disposed, may be adjacent to the display area DA and may entirely surround the display area DA. In an embodiment, the display area DA may have a substantially rectangular shape having substantially longer sides in a ±y direction. Alternatively, the display area DA may have a substantially rectangular shape having substantially longer sides in a ±x direction, a substantially polygonal shape such as a square or the like, a substantially elliptical shape, or a substantially circular shape.

Figure 2:
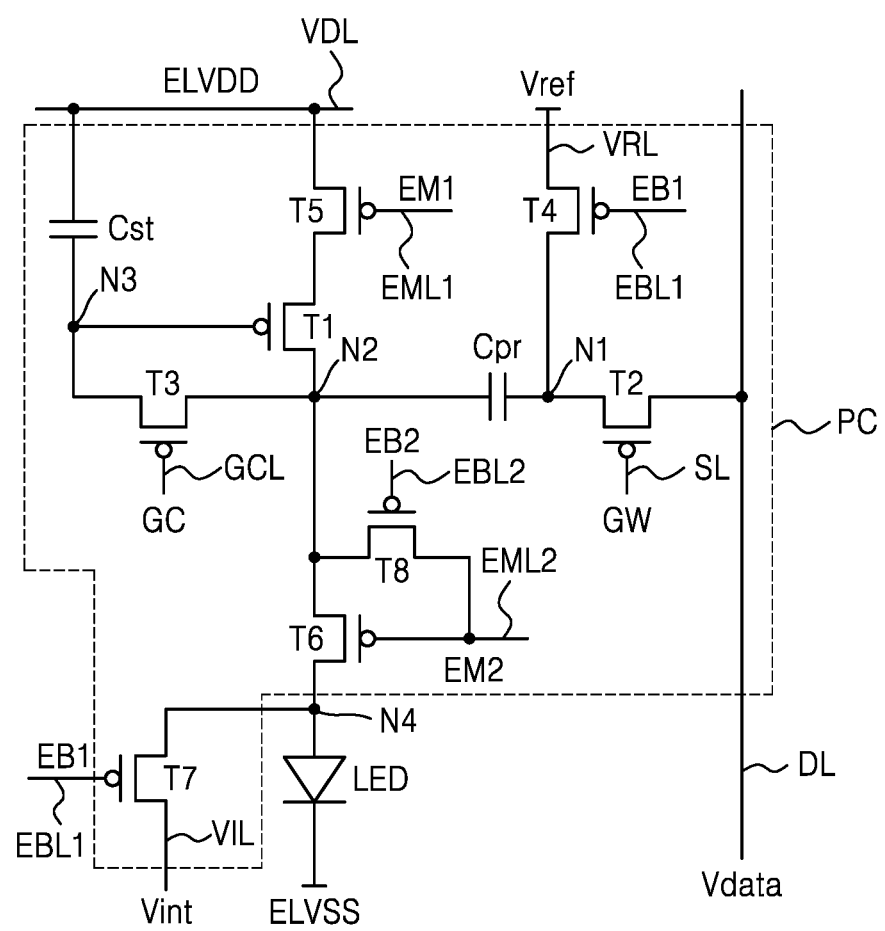
FIG. 2 is an equivalent circuit diagram of a pixel circuit electrically connected to a display element of a display device according to an embodiment.

FIG. 2 is an equivalent circuit diagram of a pixel circuit PC electrically connected to a display element of a display device according to an embodiment.

Referring to FIG. 2, the display element, for example, a light-emitting diode LED, may be electrically connected to the pixel circuit PC, and the pixel circuit PC may include transistors and capacitors.

The pixel circuit PC may include first to eighth transistors T1, T2, T3, T4, T5, T6, T7, and T8, a first capacitor Cst, and a second capacitor Cpr.

The first transistor T1 may be a driving transistor. A gate electrode of the first transistor T1 (hereinafter, referred to as the first gate electrode) may be electrically connected to a first capacitor plate of the first capacitor Cst, a first electrode of the first transistor T1 may be electrically connected to a driving voltage line VDL that may supply a driving power voltage ELVDD via the fifth transistor T5, and a second electrode of the first transistor T1 may be electrically connected to a pixel electrode (for example, an anode) of the light-emitting diode LED via the sixth transistor T6. An opposite electrode (e.g., cathode) of the light-emitting diode LED may be electrically connected a power line that may be configured to supply a common power voltage ELVSS. One of the first and second electrodes of the first transistor T1 may be a source electrode of the first transistor T1 and the other may be a drain electrode of the first transistor T1. The first transistor T1 may generate a driving current having a magnitude determined based on a voltage between the first gate electrode and the first electrode and a threshold voltage of the first transistor T1.

The first capacitor Cst may include the first capacitor plate electrically connected to the first gate electrode of the first transistor T1 and a second capacitor plate electrically connected to the driving voltage line VDL. The first capacitor Cst may store a voltage that may determine a magnitude of a driving current generated by the first transistor T1.

The second transistor T2 may be a switching transistor. A gate electrode of the second transistor T2 (hereinafter, referred to as the second gate electrode) may be electrically connected to a scan line SL, a first electrode of the second transistor T2 may be electrically connected to a data line DL, and a second electrode of the second transistor T2 may be electrically connected to a first node N1. One of the first and second electrodes of the second transistor T2 may be a source electrode of the second transistor T2 and the other may be a drain electrode of the second transistor T2. The second transistor T2 may transmit a data voltage Vdata to the first node N1 in response to a scan signal GW.

A gate electrode of the third transistor T3 (hereinafter, referred to as the third gate electrode) may be electrically connected to a first control line GCL. A first electrode of the third transistor T3 may be electrically connected to the first gate electrode of the first transistor T1 and/or the first capacitor plate of the first capacitor Cst, and a second electrode of the third transistor T3 may be electrically connected to a second node N2. One of the first and second electrodes of the third transistor T3 may be a source electrode of the third transistor T3 and the other may be a drain electrode of the third transistor T3. The third transistor T3 may be turned on in response to a first control signal GC and may cause the first transistor T1 to be diode-connected by electrically connecting the first gate electrode G1 with the second electrode of the first transistor T1.

A gate electrode of the fourth transistor T4 (hereinafter, referred to as the fourth gate electrode) may be electrically connected to a second control line EBL1. A first electrode of the fourth transistor T4 may be electrically connected to a reference voltage line VRL and a second electrode of the fourth transistor T4 may be electrically connected to the first node N1. One of the first and second electrodes of the fourth transistor T4 may be a source electrode of the fourth transistor T4 and the other may be a source electrode of the fourth transistor T4. The fourth transistor T4 may apply a reference voltage Vref to the first node N1 in response to a second control signal EB1.

The second capacitor Cpr may include a first capacitor plate electrically connected to the first node N1 and a second capacitor plate electrically connected to the second node N2. The second capacitor Cpr may store a voltage corresponding to the threshold voltage of the first transistor T1 in a compensation period and transmit, to the first capacitor Cst, a voltage corresponding to a data voltage by using a charge sharing method in a data writing period.

A gate electrode of the fifth transistor T5 (hereinafter, referred to as the fifth gate electrode) may be electrically connected to a third control line EML1. A first electrode of the fifth transistor T5 may be electrically connected to the driving voltage line VDL, and a second electrode of the fifth transistor T5 may be electrically connected to the first electrode of the first transistor T1. One of the first and second electrodes of the fifth transistor T5 may be a source electrode of the fifth transistor T5 and the other may be a drain electrode of the fifth transistor T5. The fifth transistor T5 may electrically connect the driving voltage line VDL and the first electrode of the first transistor T1 to each other in response to a third control signal EM1.

A gate electrode of the sixth transistor T6 (hereinafter, referred to as the sixth gate electrode) may be electrically connected to a fourth control line EML2. A first electrode of the sixth transistor T6 may be electrically connected to the second node N2 and a second electrode of the sixth transistor T6 may be electrically connected to the light-emitting diode LED. One of the first and second electrodes of the sixth transistor T6 may be a source electrode of the sixth transistor T6 and the other may be a drain electrode of the sixth transistor T6. The sixth transistor T6 may electrically connect the second electrode of the first transistor T1 and the light-emitting diode LED to each other in response to a fourth control signal EM2.

A gate electrode of the seventh transistor T7 (hereinafter, referred to as the seventh gate electrode) may be electrically connected to the second control line EBL1. A first electrode of the seventh transistor T7 may be electrically connected to an initialization voltage line VIL and a second electrode of the seventh transistor T7 may be electrically connected to the light-emitting diode LED, for example, the pixel electrode (for example, the anode) of the light-emitting diode LED. One of the first and second electrodes of the seventh transistor T7 may be a source electrode of the sixth transistor T6 and the other may be a drain electrode of the seventh transistor T7. The seventh transistor T7 may apply an initialization voltage Vint to the anode of the light-emitting diode LED in response to the second control signal EB1.

A gate electrode of the eighth transistor T8 (hereinafter, referred to as the eighth gate electrode) may be electrically connected to a fifth control line EBL2. A first electrode of the eighth transistor T8 may be electrically connected to the fourth control line EML2 and a second electrode of the eighth transistor T8 may be electrically connected to the second node N2. The eighth transistor T8 may apply the fourth control signal EM2 to the second node N2 by electrically connecting the fourth control line EML2 to the second node N2 in response to a fifth control signal EB2.

Figure 3:
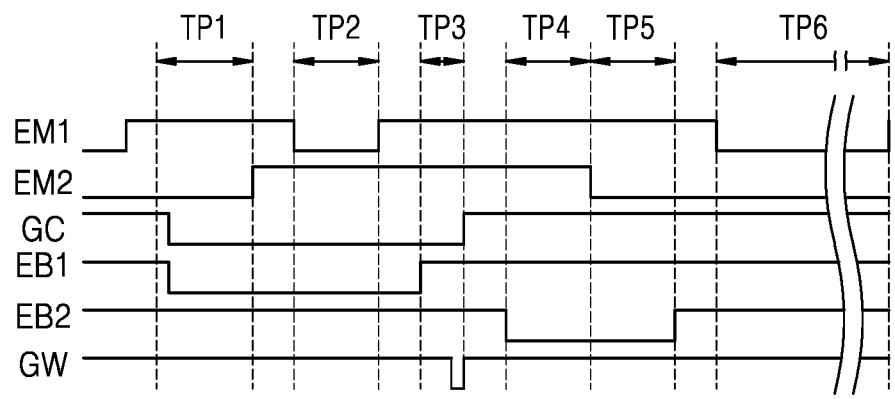
FIG. 3 is a timing diagram of example signals applied to a pixel circuit of a display device according to an embodiment.

FIG. 3 is a timing diagram of example signals applied to a pixel circuit of a display device according to an embodiment.

Referring to FIG. 3, each frame of the display device according to an embodiment may include a compensation period in which a threshold voltage may be compensated and a data writing period in which a data signal may be written, and the compensation period and the aforementioned data writing period may each exist separately. In a case that the compensation period and the data writing period are the same, for example, when a data voltage is written to a pixel while compensating for a threshold voltage of a driving transistor (a comparative example), a considerable amount of time may be required to completely compensate for the threshold voltage. On the other hand, in an embodiment, because there is a data writing period for writing a data voltage to each pixel after a compensation period for simultaneously compensating for threshold voltages of driving transistors of all pixels, a sufficient amount of time for compensation may be secured and the data writing time may be set short. Accordingly, the display device according to an embodiment may be more advantageous for high-speed driving.

In an initialization period TP1, because a fourth control signal EM2 supplied via the fourth control line EML2 (see FIG. 2) may maintain a low-level voltage, the sixth transistor T6 may be turned on. In a case that a first control signal GC supplied via the first control line GCL (see FIG. 2) and a second control signal EB1 supplied via the second control line EBL1 (see FIG. 2) are changed from a high-level voltage to a low-level voltage, the third transistor T3, the fourth transistor T4, and the seventh transistor T7 may be turned on.

The initialization voltage Vint may be transmitted to a fourth node N4 via the seventh transistor T7, and a pixel electrode (anode) of the light-emitting diode LED electrically connected to the fourth node N4 may be initialized with the initialization voltage Vint. The initialization voltage Vint may be transmitted to the second node N2 via the sixth transistor T6, and again to a third node N3 via the third transistor T3. The first gate electrode of the first transistor T1 may be initialized with the initialization voltage Vint, and the first capacitor Cst may be initialized with a driving power voltage ELVDD and the initialization voltage Vint. A reference voltage Vref may be transmitted to the first node N1 via the fourth transistor T4. The second capacitor Cpr may be initialized with the reference voltage Vref and the initialization voltage Vint.

In a compensation period TP2, in a case that a third control signal EM1 supplied via the third control line EML1 is changed from a high-level voltage to a low-level voltage, the fifth transistor T5 may be turned on. The fourth control signal EM2 may be changed from a low-level voltage to a high-level voltage, and the sixth transistor T6 may be turned off.

The driving power voltage ELVDD may be transmitted to the first transistor T1 via the fifth transistor T5, and the first capacitor Cst may store a threshold voltage (hereinafter, Vth) of the first transistor T1. In the compensation period TP2 which may be a second period, the initialization voltage Vint may be continuously applied to the first node N1 via the fourth transistor T4, and the second capacitor Cpr may store a voltage corresponding to Vref-(ELVDD-Vth).

In a data writing period TP3 (or a third period), in a case that a scan signal GW supplied via the scan line SL is changed from a high-level voltage to a low-level voltage, the second transistor T2 may be turned on and a data voltage Vdata supplied via the data line DL may be transmitted to the first node N1. In a case that the third control signal EM1 is changed from a low-level voltage to a high-level voltage, the fifth transistor T5 may be turned off, and in a case that the second control signal EB1 is changed from a low-level voltage to a high-level voltage, the fourth and seventh transistors T4 and T7 may be turned off.

The data voltage Vdata may be transmitted to the first node N1 via the second transistor T2 and the second capacitor Cpr, and a voltage corresponding to the data voltage Vdata may be written to the first capacitor Cst by charge sharing between the first capacitor Cst and the second capacitor Cpr. For example, a voltage corresponding to ELVDD−Vth+CCpr/(CCst+CCpr)*(Vdata−Vref) may be transmitted to the second node N2, and a voltage corresponding to a difference between a voltage of the driving power voltage ELVDD and a voltage of the aforementioned second node N2 may be stored in the first capacitor Cst. Here, CCst is capacitance of the first capacitor Cst and CCpr is capacitance of the second capacitor Cpr.

In an on-bias period TP4 (or a fourth period) of the first transistor T1, in a case that the scan signal GW is changed from a low-level voltage to a high-level voltage, the second transistor T2 may be turned off. In a case that the first control signal GC is changed from a low-level voltage to a high-level voltage, the third transistor T3 may be turned off, and in a case that the fifth control signal EB2 transmitted via the fifth control line EBL2 (see FIG. 2) is changed from a high-level voltage to a low-level voltage, the eighth transistor T8 may be turned on, such that the fourth control signal EM2 supplied via the fourth control line EML2 may be transmitted to the second node N2.

In a case that the fourth control signal EM2 having a high-level voltage is transmitted to the second node N2, for example, the second electrode of the first transistor T1, via the eighth transistor T8, a voltage of the first gate electrode of the first transistor T1 may become relatively low, and the first transistor T1 may be fully turned on. In other words, the first transistor T1 may be forcibly turned on in the on-bias period TP4 of the first transistor T1 before generating a driving current in an emission period TP6, such that a hysteresis characteristic of the first transistor T1, in which a magnitude of a driving current output from the first transistor T1 to a previous frame affects a magnitude of a driving current output to a current frame, may be removed. A variation in hysteresis may be compensated for of first transistors T1 of the pixels.

In an off-bias period TP5 (or a fifth period) of the first transistor T1, in a case that the fourth control signal EM2 is changed from a high-level voltage to a low-level voltage, the sixth transistor T6 may be turned on.

The fourth control signal EM2 having a low-level voltage may be transmitted to the second node N2 and the fourth node N4 via the eighth transistor T8 and the sixth transistor T6, respectively, and the second electrode of the first transistor T1 electrically connected to the second node N2 and the pixel electrode (for example, the anode) of the light-emitting diode LED may be initialized with a low-level voltage before the emission period TP6.

In a case that the low-level voltage is applied to the second electrode of the first transistor T1, the voltage of the first gate electrode of the first transistor T1 becomes relatively high, and the first transistor T1 may be fully turned off. The first transistor T1 may be fully turned on in the fourth period TP4 before the emission period TP6 and then fully turned off in the fifth period TP5, and thus, the variation in hysteresis of the first transistors T1 may be further reduced.

The low-level voltage may be applied to the pixel electrode (for example, the anode) of the light-emitting diode LED immediately before the emission period TP6, thereby preventing a phenomenon in which the light-emitting diode LED weakly or minutely emits light (for example, a relatively small amount of light may be emitted) during the emission period TP6 in a case that a data voltage corresponding to full black may be applied to the pixel.

In the emission period TP6, in a case that the fifth control signal EB2 is changed from a low-level voltage to a high-level voltage, the eighth transistor T8 may be turned off. In a case that the third control signal EM1 is changed from a high-level voltage to a low-level voltage, the fifth transistor T5 may be turned on, and a driving current may flow through the first transistor T1 to the light-emitting diode LED based on a voltage stored in the first capacitor Cst, which may be a storage capacitor.

Because a voltage corresponding to Vth+CCpr/(CCst+CCpr)*(Vref-Vdata) is stored in the first capacitor Cst in the third period TP3, the first transistor T1 may output a driving current that may not be related to a magnitude of the threshold voltage Vth. For example, the driving current may have a magnitude proportional to [CCpr/(CCst+CCpr)*(Vref-Vdata]2.

Figure 4:
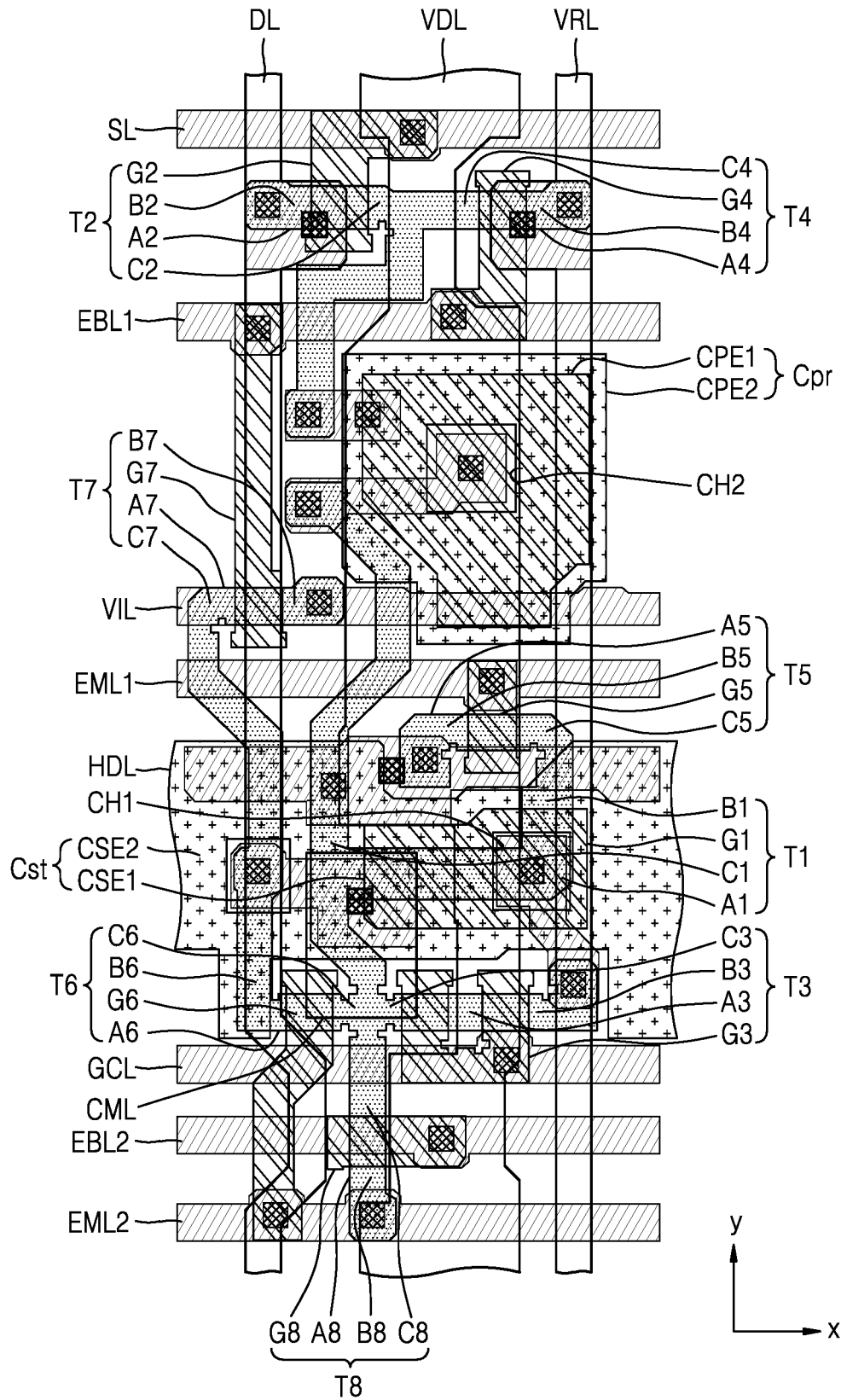
FIG. 4 is a schematic plan view of locations of transistors and capacitors of the pixel circuit of FIG. 2.

FIG. 4 is a schematic plan view of locations of transistors and capacitors of the pixel circuit of FIG. 2. Pixel circuits of the same or similar structures may be arranged or disposed in vertical and horizontal directions. For example, the pixel circuits may be arranged or disposed in a matrix form in a ±x direction and a ±y direction, and one of the pixel circuits arranged or disposed in the matrix form may have a structure as shown in FIG. 4.

Figure 5:
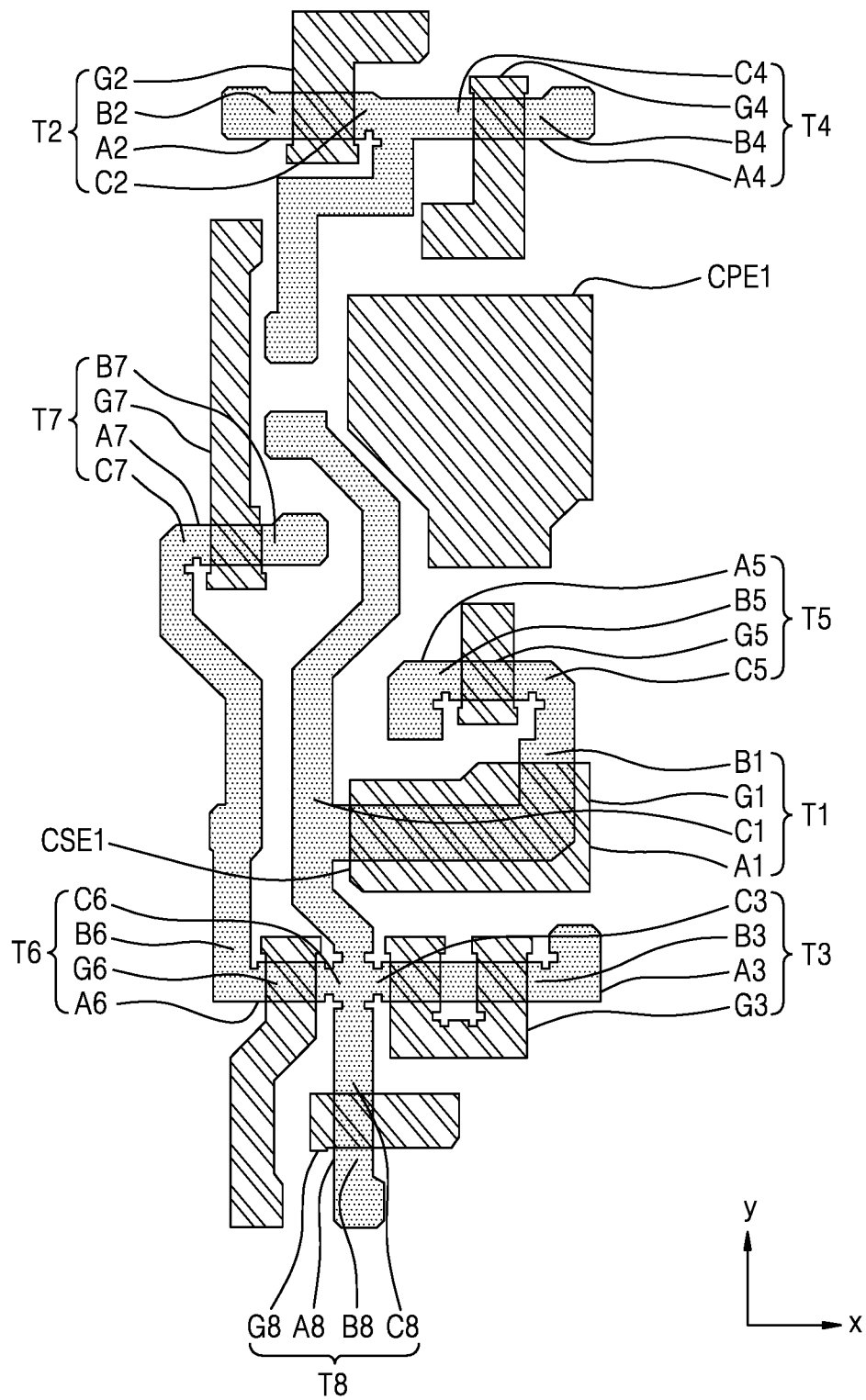
FIGS. 5 to 8 are plan views of stacked structures according to a manufacturing process of the pixel circuit of FIG. 4.
Figure 6:
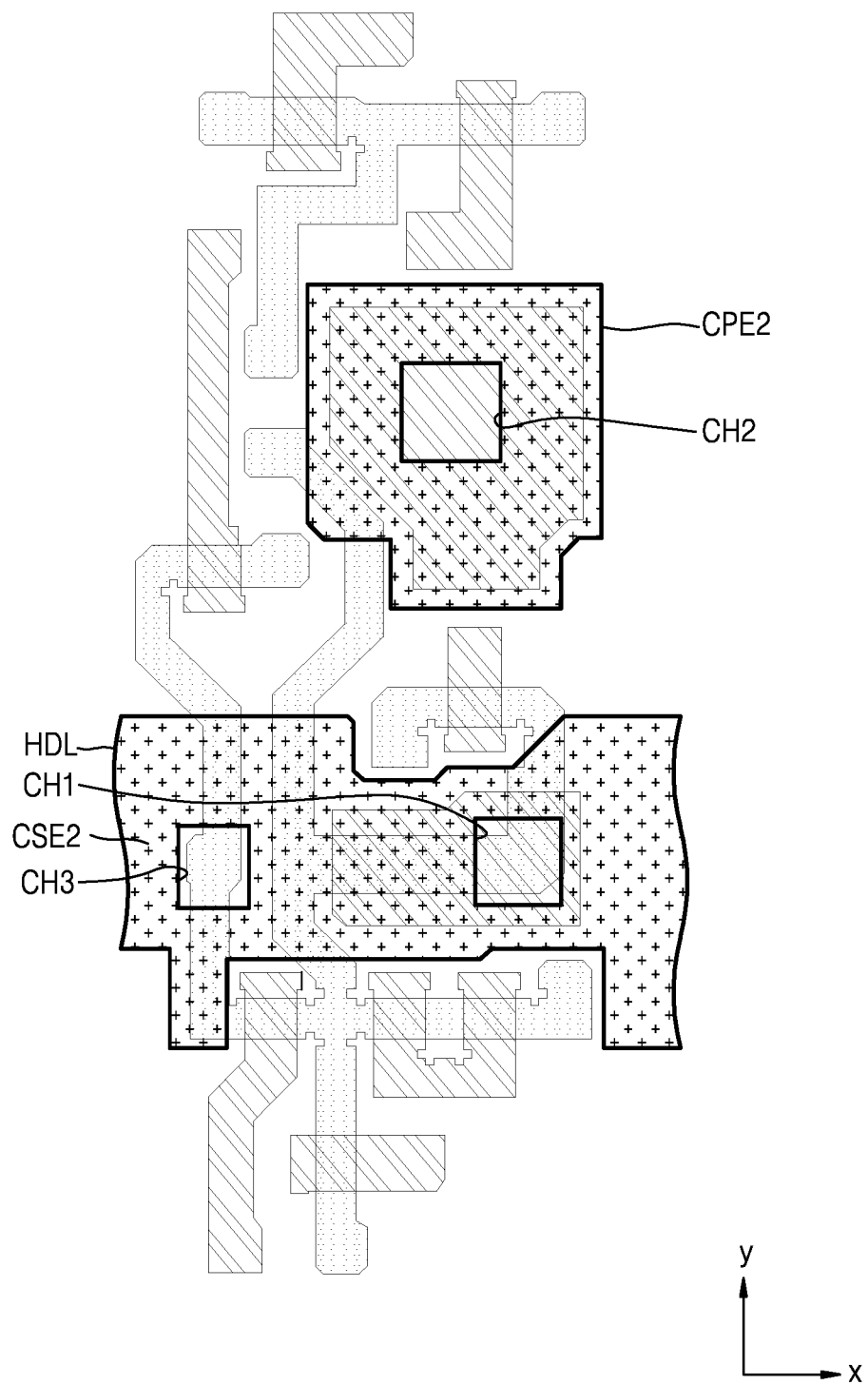
Figure 7:
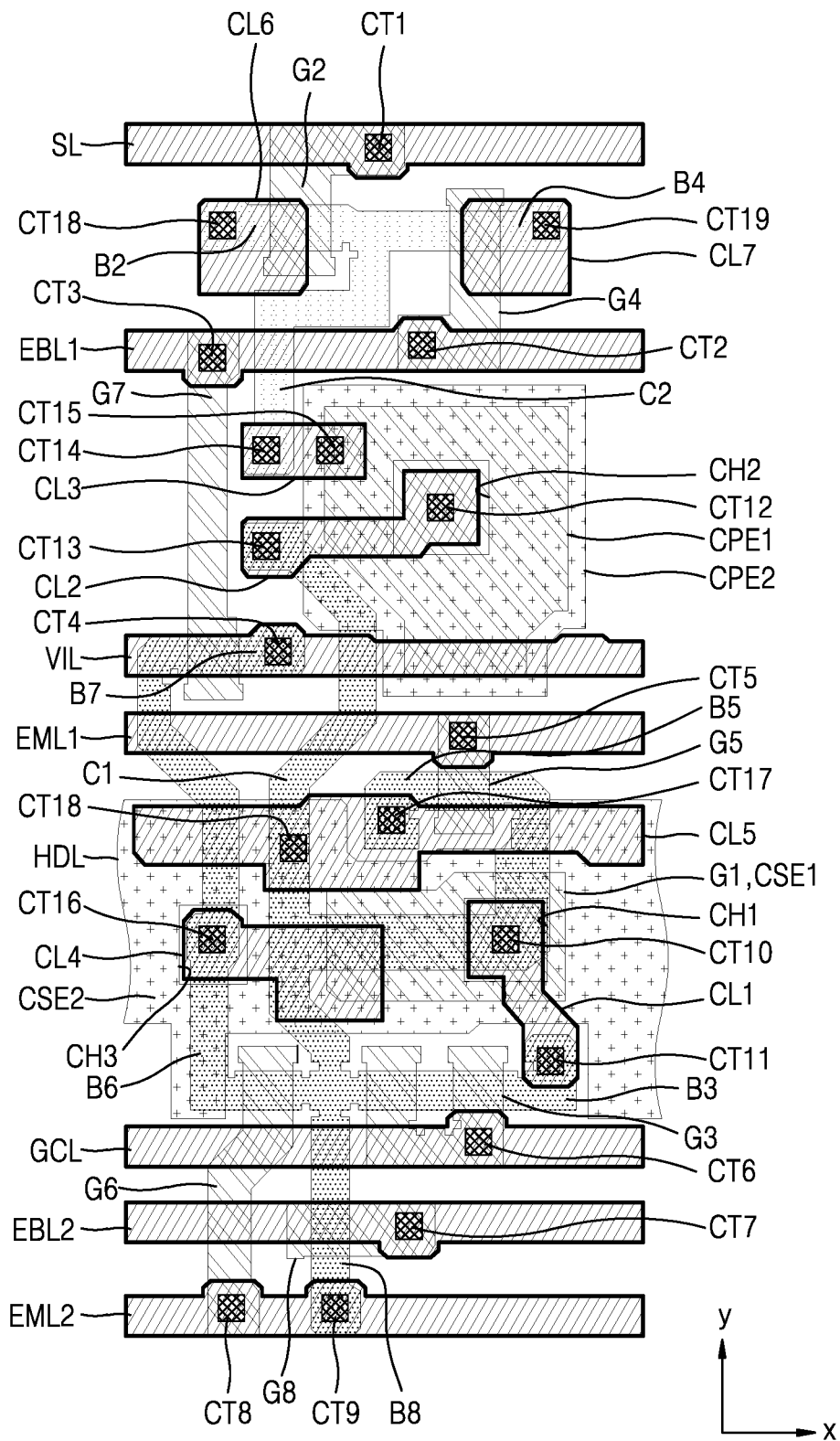
Figure 8:
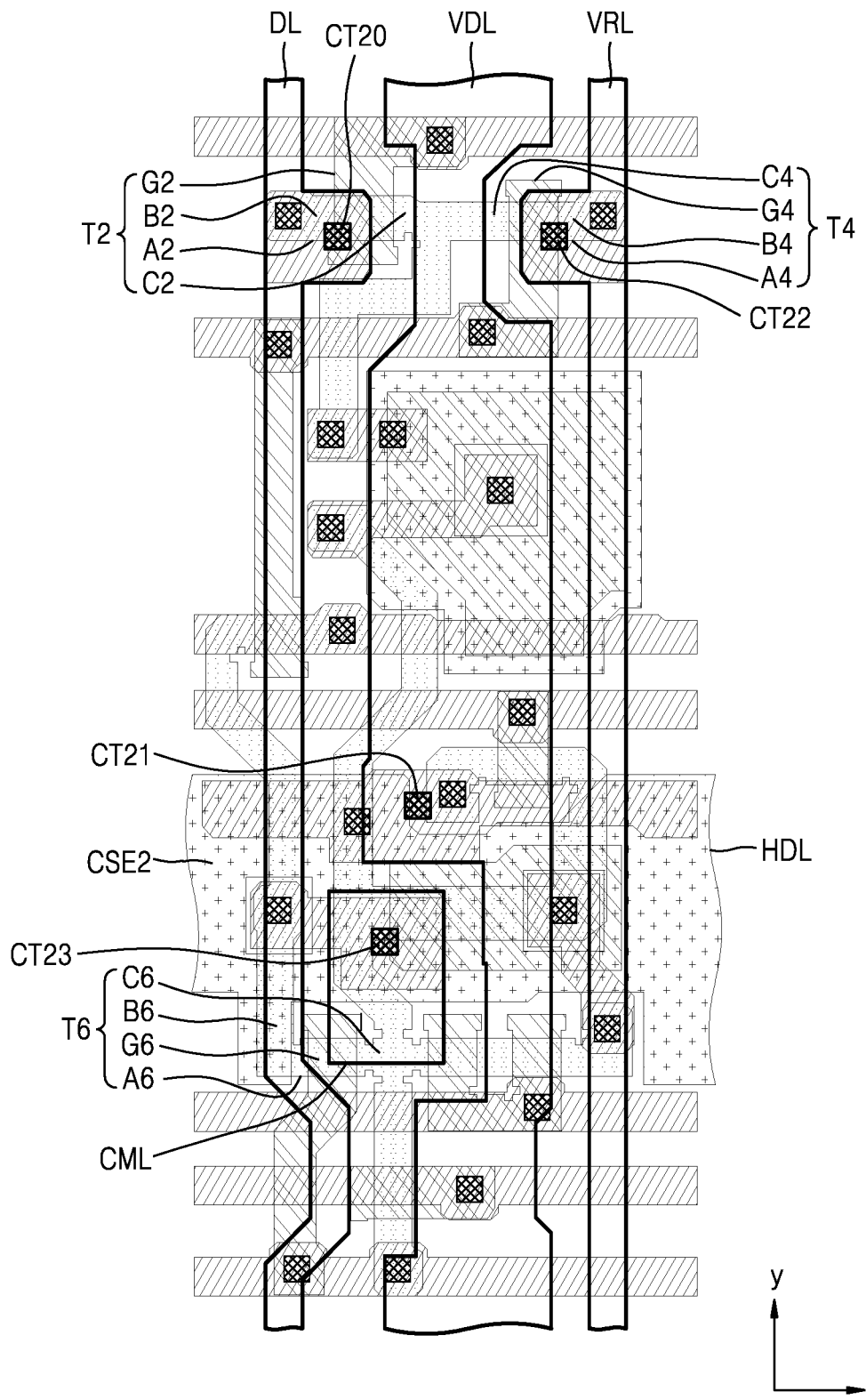

FIGS. 5 to 8 are plan views of stacked structures according to a manufacturing process of the pixel circuit of FIG. 4. FIG. 5 is a plan view of a manufacturing process in which semiconductor layers and gate electrodes may be formed. FIG. 6 is a plan view of capacitor plates and horizontal power lines formed or disposed on a layered structure of FIG. 5. FIG. 7 is a plan view of connection lines and lines extending in a first direction (for example, an x direction) formed or disposed on a layered structure of FIG. 6. FIG. 8 is a plan view of lines extending in a second direction (for example, a y direction) formed or disposed on a layered structure of FIG. 7.

At least one insulating layer may be disposed between layered structures stacked according to manufacturing processes of FIGS. 5 to 8. For example, a gate insulating layer may be disposed between first to eighth semiconductor layers A1, A2, A3, A4, A5, A6, A7, and A8 and first to eighth gate electrodes G1, G2, G3, G4, G5, G6, G7, and G8 shown in FIG. 5, respectively. A process of forming a first interlayer insulating layer may be further included between the manufacturing process of FIG. 5 and the manufacturing process of FIG. 6, and a process of forming a second interlayer insulating layer may be further included between the manufacturing process of FIG. 6 and the manufacturing process of FIG. 7. A process of forming a first planarization insulating layer may be further included between the manufacturing process of FIG. 7 and the manufacturing process of FIG. 8. Contact hole(s) may be formed or disposed in the aforementioned insulating layers (for example, the gate insulating layer, the first interlayer insulating layer, the second interlayer insulating layer, and the planarization insulating layer), respectively. The layered structures of FIGS. 5 to 8 may be electrically connected to each other through the corresponding contact hole(s).

Referring to FIG. 4, the pixel circuit may include a scan line SL that may provide a scan signal GW (see FIG. 3), a first control line GCL that may provide a first control signal GC (see FIG. 3), a second control line EBL1 that may provide a second control signal EB1 (see FIG. 3), a third control line EML1 that may provide a third control signal EM1 (see FIG. 3), a fourth control line EML2 that may provide a fourth control signal EM2 (see FIG. 3), a fifth control line EBL2 that may provide a fifth control signal EB2 (see FIG. 3), and an initialization voltage line VIL that may provide an initialization voltage Vint (see FIG. 3).

The scan line SL, the first control line GCL, the second control line EBL1, the third control line EML1, the fourth control line EML2, the fifth control line EBL2, and the initialization voltage line VIL may extend in the first direction (for example, the x direction). In an embodiment, the scan line SL, the second control line EBL1, the initialization voltage line VIL, the third control line EML1, the first control line GCL, the fifth control line EBL2, and the fourth control line EML2 may be sequentially arranged or disposed in the second direction (for example, the y direction).

The pixel circuit may include a data line DL that may provide a data voltage Vdata (see FIG. 3) corresponding to a data signal, a driving voltage line VDL that may provide a driving power voltage ELVDD (see FIG. 3), and a reference voltage line VRL that may provide a reference voltage Vref (see FIG. 3).

The data line DL, the driving voltage line VDL, and the reference voltage line VRL may extend in the second direction (for example, the y direction). In an embodiment, the data line DL, the driving voltage line VDL, and the reference voltage line VRL may be sequentially arranged or disposed in the first direction (for example, the x direction).

The first to eighth transistors T1 to T8 may be formed or disposed along at least one semiconductor layer and the at least one semiconductor layer may be bent in various shapes. The at least one semiconductor layer may include a first semiconductor layer A1 corresponding to the first transistor T1, a second semiconductor layer A2 corresponding to the second transistor T2, a third semiconductor layer A3 corresponding to the third transistor T3, a fourth semiconductor layer A4 corresponding to the fourth transistor T4, a fifth semiconductor layer A5 corresponding to the fifth transistor T5, a sixth semiconductor layer A6 corresponding to the sixth transistor T6, a seventh semiconductor layer A7 corresponding to the seventh transistor T7, and an eighth semiconductor layer A8 corresponding to the eighth transistor T8.

Referring to FIGS. 4 and 5, the first semiconductor layer A1 may include a first channel region overlapping a first gate electrode G1, and first and second high-concentration impurity regions B1 and C1 on both sides of the first channel region. The second semiconductor layer A2 may include a second channel region overlapping a second gate electrode G2, and first and second high-concentration impurity regions B2 and C2 on both sides of the second channel region. The third semiconductor layer A3 may include a third channel region overlapping a third gate electrode G3, and first and second high-concentration impurity regions B3 and C3 on both sides of the third channel region. The fourth semiconductor layer A4 may include a fourth channel region overlapping a fourth gate electrode G4, and first and second high-concentration impurity regions B4 and C4 on both sides of the fourth channel region. The fifth semiconductor layer A5 may include a fifth channel region overlapping a fifth gate electrode G5, and first and second high-concentration impurity regions B5 and C5 on both sides of the fifth channel region. The sixth semiconductor layer A6 may include a sixth channel region overlapping a sixth gate electrode G6, and first and second high-concentration impurity regions B6 and C6 on both sides of the sixth channel region. The seventh semiconductor layer A7 may include a seventh channel region overlapping a seventh gate electrode G7, and first and second high-concentration impurity regions B7 and C7 on both sides of the seventh channel region. The eighth semiconductor layer A8 may include an eighth channel region overlapping an eighth gate electrode G8, and first and second high-concentration impurity regions B8 and C8 on both sides of the eighth channel region.

Some or a predetermined number of the first to eighth semiconductor layers A1 to A8 may be connected to each other. For example, as shown in FIG. 5, the second semiconductor layer A2 and the fourth semiconductor layer A4 may be connected to each other and formed as one body, and the first semiconductor layer A1, the third semiconductor layer A3, the fifth semiconductor layer A5, the sixth semiconductor layer A6, the seventh semiconductor layer A7, and the eighth semiconductor layer A8 may be connected to each other and formed as one body.

Each of the first to eighth semiconductor layers A1 to A8 may include polysilicon. As described above, the first to eighth semiconductor layers A1 to A8 may include the respective channel regions and the respective high-concentration impurity regions doped with impurities on both sides of the respective channel regions. The first and second high-concentration impurity regions may include a higher concentration of impurities than the channel regions, and one of the first and second high-concentration impurity regions may be a source region and the other may be a drain region. The source region and the drain region may be a source electrode and a drain electrode, respectively. For example, the first and second high-concentration impurity regions B1 and C1 of the first transistor T1 may be a source region (or source electrode) and a drain region (or drain electrode), respectively. Similarly, one of the first and second high-concentration impurity regions of the respective second to eighth transistors T2 to T8 may be a source region (or source electrode) and the other may be a drain region (or drain electrode). The impurities may vary depending on a type of a transistor and may include an N-type impurity or a P-type impurity.

Portions or regions between adjacent semiconductor layers among the first to eighth semiconductor layers A1 to A8 shown in FIG. 5 may also be doped with impurities so as to serve as wires electrically connecting transistors.

The first capacitor Cst may overlap the first transistor T1. For example, as shown in FIGS. 4 and 5, the first capacitor Cst may include a first capacitor plate CSE1 having an isolated pattern (or island pattern), and the first capacitor plate CSE1 may overlap the first channel region of the first transistor T1. For example, the first capacitor plate CSE1 may include the first gate electrode G1. Alternatively, the first gate electrode G1 of the first transistor T1 may include the first capacitor plate CSE1.

As shown in FIGS. 4 and 6, the first capacitor Cst may include a second capacitor plate CSE2 overlapping the first capacitor plate CSE1. The second capacitor plate CSE2 may overlap the first capacitor plate CSE1 and may include a first hole CH1. The first hole CH1 of the second capacitor plate CSE2 may overlap the first capacitor plate CSE1. The second capacitor plate CSE2 may be a part of a horizontal power line HDL extending in the first direction (for example, the x direction). For example, the horizontal power line HDL may include the second capacitor plate CSE2 of the first capacitor Cst.

The second capacitor Cpr may be apart from the first capacitor Cst in a plan view of FIG. 4. The second capacitor Cpr and the first capacitor Cst may be arranged or disposed in the second direction (for example, the y direction). For example, the second capacitor Cpr may be apart from the first capacitor Cst with the third control line EML1 and/or the fifth transistor T5 disposed therebetween. The first capacitor Cst may be disposed between the third control line EML1 and the first control line GCL, and the second capacitor Cpr may be disposed between the third control line EML1 and the second control line EBL1.

The second capacitor Cpr may include a third capacitor plate CPE1 having an isolated pattern (or island pattern) as shown in FIGS. 4 and 5, and a fourth capacitor plate CPE2 having an isolated pattern (or island pattern) as shown in FIGS. 4 and 6. The fourth capacitor plate CPE2 may overlap the third capacitor plate CPE1 and may include a second hole CH2. The second hole CH2 may overlap the third capacitor plate CPE1. A size (or width) of the second hole CH2 may be different from a size (or width) of the first hole CH1. For example, the size (or width) of the second hole CH2 may be greater than the size (or width) of the first hole CH1.

The first to eighth gate electrodes G1 to G8, the first capacitor plate CSE1, and the third capacitor plate CPE1 shown in FIG. 5 may include the same or similar material. The first to eighth gate electrodes G1 to G8, the first capacitor plate CSE1, and the third capacitor plate CPE1 may include a low-resistance conductive material such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may include a single-layered or multi-layered structure containing the aforementioned materials. In an embodiment, the third gate electrode G3 may be a dual gate electrode as shown in FIG. 5, but in an embodiment, the third gate electrode G3 may be a single gate electrode.

The second capacitor plate CSE2, the fourth capacitor plate CPE2, and the horizontal power line HDL shown in FIG. 6 may include the same or similar material. The second capacitor plate CSE2, the fourth capacitor plate CPE2, and the horizontal power line HDL may include a metal such as Al, Pt, Pd, Ag, Mg, Au, Ni, Nd, Ir, Cr, Ca, Mo, T1, W, and Cu, and may include a single-layered or multi-layered structure containing the aforementioned materials.

The horizontal power line HDL may extend in a first direction (for example, a ±x direction). For example, horizontal power lines HDL of pixel circuits arranged or disposed in the first direction may be electrically connected to each other as one line. Each horizontal power line HDL may include a third hole CH3. The third hole CH3 may be a hole for electrical connection between the sixth transistor T6 and a fourth connection line CL4 (see FIG. 7) which will be described later.

Referring to FIG. 7, a scan line SL, a second control line EBL1, a third control line EML1, a first control line GCL, a fifth control line EBL2, and a fourth control line EML2 may be formed or disposed on a stacked structure of FIG. 6. The scan line SL, the second control line EBL1, the third control line EML1, the first control line GCL, the fifth control line EBL2, and the fourth control line EML2 may be respectively electrically connected to an electrode or a semiconductor layer.

The scan line SL may be electrically connected to the second gate electrode G2 through a first contact hole CT1. The second control line EBL1 may be electrically connected to the fourth gate electrode G4 through a second contact hole CT2 and may be electrically connected to the seventh gate electrode G7 through a third contact hole CT3. The initialization voltage line VIL may be electrically connected to the first high-concentration impurity region B7 of the seventh transistor T7 (see FIG. 4) through a fourth contact hole CT4. The third control line EML1 may be electrically connected to the fifth gate electrode G5 through a fifth contact hole CT5, and the first control line GCL may be electrically connected to the third gate electrode G3 through a sixth contact hole CT6. The fifth control line EBL2 may be electrically connected to the eighth gate electrode G8 through a seventh contact hole CT7. The fourth control line EML2 may be electrically connected to the sixth gate electrode G6 through an eighth contact hole CT8 and may be electrically connected to the first high-concentration impurity region B8 of the eighth transistor T8 (see FIG. 4) through a ninth contact hole CT9.

First to seventh connection lines CL1, CL2, CL3, CL4, CL5, CL6, and CL7 may be formed together with the scan line SL or the like, as shown in FIG. 7.

The first connection line CL1 may electrically connect the first gate electrode G1 of the first transistor T1 (see FIG. 4) to the first high-concentration impurity region B3 of the third transistor T3 (see FIG. 4). Alternatively, the first connection line CL1 may electrically connect the first capacitor plate CSE1 of the first capacitor Cst (see FIG. 4) to the first high-concentration impurity region B3 of the third transistor T3 (see FIG. 4). One or an end of the first connection line CL1 may be electrically connected to the first gate electrode G1 and/or the first capacitor plate CSE1 through the first hole CH1 in the second capacitor plate CSE2. In this regard, it is shown in FIG. 7 that the one or an end of the first connection line CL1 may be electrically connected to the first gate electrode G1 and/or the first capacitor plate CSE1 through a tenth contact hole CT10, and the tenth contact hole CT10 may overlap the first hole CH1. The other or another end of the first connection line CL1 may be electrically connected to the third semiconductor layer, for example, the first high-concentration impurity region B3, of the third transistor T3 (see FIG. 4) through an eleventh contact hole CT11.

The second connection line CL2 may electrically connect the third capacitor plate CPE1 of the second capacitor Cpr (see FIG. 4) to the first transistor T1 (see FIG. 4), and the third connection line CL3 may electrically connect the fourth capacitor plate CPE2 of the second capacitor Cpr (see FIG. 4) to the second transistor T2 (see FIG. 4).

One or an end of the second connection line CL2 may be electrically connected to the third capacitor plate CPE1 through the second hole CH2 in the fourth capacitor plate CPE2. In this regard, it is shown in FIG. 7 that the one or an end of the second connection line CL2 may be electrically connected to the third capacitor plate CPE1 through a twelfth contact hole CT12, and the twelfth contact hole CT12 may overlap the second hole CH2. The other or another end of the second connection line CL2 may be electrically connected to the first semiconductor layer A1, for example, the second high-concentration impurity region C1, of the first transistor T1 (see FIG. 4) through a thirteenth contact hole CT13.

One or an end of the third connection line CL3 may be electrically connected to the second semiconductor layer, for example, the second high-concentration impurity region C2, of the second transistor T2 (see FIG. 4) through a fourteenth contact hole CT14, and the other end of the third connection line CL3 may be electrically connected to the fourth capacitor plate CPE2 through a fifteenth contact hole CT15.

The fourth connection line CL4 may be electrically connected to the sixth transistor T6 (see FIG. 4). For example, the fourth connection line CL4 may be electrically connected to the sixth semiconductor layer of the sixth transistor T6 (see FIG. 4) through the third hole CH3 in the horizontal power line HDL. In this regard, it may be shown in FIG. 7 that one or an end of the fourth connection line CL4 may be electrically connected to the sixth semiconductor layer, for example, the first high-concentration impurity region B6, of the sixth transistor T6 (see FIG. 4) through a sixteenth contact hole CT16.

A fifth connection line CL5 may extend in the same direction as the horizontal power line HDL in connection with the horizontal power line HDL. The fifth connection line CL5 may be a kind of auxiliary horizontal power line. For example, fifth connection lines CL5 of the pixel circuits arranged or disposed in the first direction may be electrically connected to each other as one line.

Each fifth connection line CL5 may be electrically connected to the fifth semiconductor layer, for example, the first high-concentration impurity region B5, of the fifth transistor T5 (see FIG. 4) through a seventeenth contact hole CT17 and may be electrically connected to the horizontal power line HDL through an eighteenth contact hole CT18.

A sixth connection line CL6 may be electrically connected to the first high-concentration impurity region B2 of the second semiconductor layer of the second transistor T2 (see FIG. 4) through the eighteenth contact hole CT18. A seventh connection line CL7 may be electrically connected to the first high-concentration impurity region B4 of the fourth semiconductor layer of the fourth transistor T4 (see FIG. 4) through a nineteenth contact hole CT19.

The layers shown in FIG. 7, for example, the scan line SL, the second control line EBL1, the initialization voltage line VIL, the third control line EML1, the first control line GCL, the fifth control line EBL2, the fourth control line EML2, and the first to seventh connection lines CL1 to CL7 may include the same or similar material. The scan line SL, the second control line EBL1, the initialization voltage line VIL, the third control line EML1, the first control line GCL, the fifth control line EBL2, the fourth control line EML2, and the first to seventh connection lines CL1 to CL7 may include Mo, Al, Cu, T1, or other suitable materials within the spirit and the scope of the disclosure and may be formed of a multi-layer or a single layer containing the aforementioned materials. The multi-layer may have a structure in which a titanium layer, an aluminum layer, and a titanium layer may be sequentially stacked (Ti/Al/Ti).

Referring to FIG. 8, a data line DL, a driving voltage line VDL, a reference voltage line VRL, and a connection metal layer CIVIL may be formed or disposed on a layered structure of FIG. 7.

The data line DL may be electrically connected to the second transistor T2. For example, the data line DL may be electrically connected to the sixth connection line CL6 (see FIG. 7) through a twentieth contact hole CT20 and may be electrically connected to the second transistor T2 via the sixth connection line CL6 (see FIG. 7).

The driving voltage line VDL may be electrically connected to the second capacitor plate CSE2 of the first capacitor Cst and/or the horizontal power line HDL. For example, the driving voltage line VDL may be electrically connected to the fifth connection line CL5 (see FIG. 7) through a twenty-first contact hole CT21 and may be electrically connected to the horizontal power line HDL and/or the second capacitor plate CSE2 via the fifth connection line CL5 (see FIG. 7).

The reference voltage line VRL may be electrically connected to the fourth transistor T4. For example, the reference voltage line VRL may be electrically connected to the fourth transistor T4 via the seventh connection line CL7 (see FIG. 7) that may be electrically connected through a twenty-second contact hole CT22.

The connection metal layer CIVIL may be electrically connected to the fourth connection line CL4 (see FIG. 7) through a twenty-third contact hole CT23. The connection metal layer CIVIL may serve as a medium that may electrically connect the sixth transistor T6 to a pixel electrode (for example, an anode) of an organic light-emitting diode which will be described later.

The data line DL, the driving voltage line VDL, the reference voltage line VRL, and the connection metal layer CIVIL may include the same or similar material. The data line DL, the driving voltage line VDL, the reference voltage line VRL, and the connection metal layer CIVIL may include Mo, Al, Cu, T1, or other suitable materials within the spirit and the scope of the disclosure. and may be formed of a multi-layer or single-layer containing the aforementioned materials. The multi-layer may have a structure in which a titanium layer, an aluminum layer, and a titanium layer may be sequentially stacked (Ti/Al/Ti).

Figure 9:
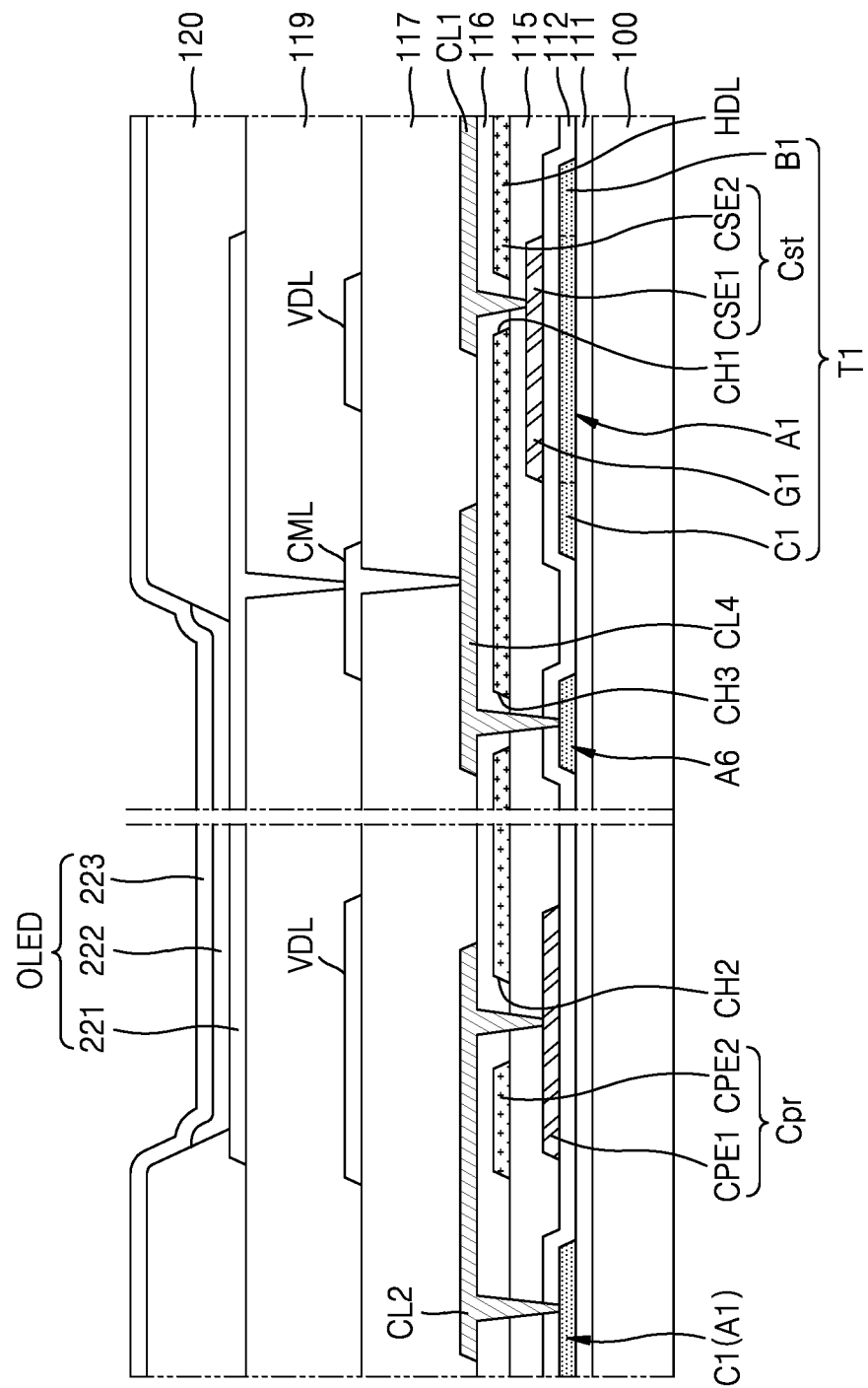
FIG. 9 is a schematic cross-sectional view of a display device according to an embodiment.

FIG. 9 is a schematic cross-sectional view of a display device according to an embodiment.

Referring to FIG. 9, a buffer layer 111 may be formed or disposed on a substrate 100, and the first to eighth semiconductor layers described with reference to FIG. 4 may be arranged or disposed on the buffer layer 111. In this regard, FIG. 9 shows a first semiconductor layer A1 and a sixth semiconductor layer A6.

The buffer layer 111 may reduce or block the penetration of foreign matter, moisture, or external air from below the substrate 100 and may provide a flat surface on the substrate 100. The buffer layer 111 may include an inorganic insulating layer such as silicon oxide, silicon oxynitride, and silicon nitride and may be formed of a single-layered or multi-layered structure containing the aforementioned materials.

A gate insulating layer 112 may be formed or disposed on the semiconductor layers, and the layered structure described with reference to FIG. 5, for example, the gate electrodes, the first capacitor plate CSE1, and the third capacitor plate CPE1, may be arranged or disposed on the gate insulating layer 112. In this regard, in FIG. 9, the first gate electrode G1, the first capacitor plate CSE1, and the third capacitor plate CPE1 are shown. The gate insulating layer 112 may include an inorganic insulating material such as silicon oxide, silicon oxynitride, and silicon nitride and may be formed of a single-layered or multi-layered structure containing the aforementioned materials.

A first interlayer insulating layer 113 may be arranged or disposed on the gate electrodes, the first capacitor plate CSE1, and the third capacitor plate CPE1. The first interlayer insulating layer 113 may include an inorganic insulating material such as silicon oxide, silicon oxynitride, and silicon nitride and may be formed of a single-layered or multi-layered structure containing the aforementioned materials.

The layered structure described with reference to FIG. 6, for example, the horizontal power line HDL, the second capacitor plate CSE2, and the fourth capacitor plate CPE2, may be arranged or disposed on the first interlayer insulating layer 113. A second interlayer insulating layer 116 may be arranged or disposed on the horizontal power line HDL, the second capacitor plate CSE2, and the fourth capacitor plate CPE2. The second interlayer insulating layer 116 may include an inorganic insulating material such as silicon oxide, silicon oxynitride, and silicon nitride and may be formed of a single-layered or multi-layered structure containing the aforementioned materials.

The layered structure described with reference to FIG. 7, for example, the scan line, the first to fifth control lines, and the first to seventh connection lines, may be arranged or disposed on the second interlayer insulating layer 116. In this regard, it may be shown in FIG. 9 that the first connection line CL1, the second connection line CL2, and the fourth connection line CL4 may be arranged or disposed on the second interlayer insulating layer 116.

The first connection line CL1 may be electrically connected to the first capacitor plate CSE1 through the first hole CH1. One or an end of the second connection line CL2 may be electrically connected to the third capacitor plate CPE1 through the second hole CH2, and the other end of the second connection line CL2 may be electrically connected to the first semiconductor layer A1, for example, the second high-concentration impurity region C1.

A first planarization insulating layer 117 may be arranged or disposed on the first connection line CL1, the second connection line CL2, and the fourth connection line CL4. The first planarization insulating layer 117 may include an organic insulating material such as acryl, benzocyclobutene (BCB), polyimide, or hexamethyldisiloxane (HMDSO).

The layered structure described with reference to FIG. 8, for example, the driving voltage line VDL, the connection metal layer CML, and the like, may be arranged or disposed on the first planarization insulating layer 117. The connection metal layer CIVIL may be electrically connected to the fourth connection line CL4, and the fourth connection line CL4 may be electrically connected to the sixth semiconductor layer A6 through the third hole CH3.

A pixel electrode 221 may be arranged or disposed on a second planarization insulating layer 119 and may be electrically connected to the connection metal layer CIVIL through a contact hole in the second planarization insulating layer 119. The pixel electrode 221 may be electrically connected to the sixth semiconductor layer A6 of the sixth transistor via the connection metal layer CIVIL and the fourth connection line CL4. The second planarization insulating layer 119 may include an organic insulating material such as acryl, BCB, polyimide, or HMDSO.

An upper insulating layer 120 may be arranged or disposed on the pixel electrode 221. The upper insulating layer 120 may cover or overlap edges of the pixel electrode 221, but may include an opening overlapping a central portion of the pixel electrode 221. The upper insulating layer 120 may include an organic insulating layer such as BCB, polyimide, or HMDSO.

An emission layer 222 may overlap the pixel electrode 221 through the opening of the upper insulating layer 120. The emission layer 222 may include an organic material capable of emitting light of a certain or predetermined color. Although not illustrated, a hole injection layer (HIL), a hole transport layer (HTL), an electron transport layer (ETL), and/or an electron injection layer (EIL) may be provided or disposed below and/or above the emission layer 222.

An opposite electrode 223 may be formed of a conductive material having a relatively low work function. For example, the opposite electrode 223 may include a (semi) transparent layer including Ag, Mg, Al, Ni, Cr, Li, Ca, or an alloy thereof. Alternatively, the opposite electrode 223 may include, on the (semi) transparent layer, a layer such as indium tin oxide (ITO), indium zinc oxide (IZO), zinc oxide (ZnO), or indium oxide (In2O3). In an embodiment, the opposite electrode 223 may include Ag and Mg.

According to an embodiment described with reference to FIG. 9, although it is described that a light-emitting diode may be an organic light-emitting diode OLED including a stack of the pixel electrode 221, the emission layer 222, and the opposite electrode 223, in an embodiment, the light-emitting diode may be an inorganic light-emitting diode including an inorganic material. The inorganic light-emitting diode may include a PN diode including inorganic semiconductor-based materials. In a case that a voltage is applied to a PN junction diode in a forward direction, holes and electrons may be injected, and energy generated by a recombination of the holes and the electrons may be converted into light energy, so as to emit light of a certain or predetermined color. The aforementioned inorganic light-emitting diode may have a width of several to several hundreds of micrometers, and in an embodiment, the inorganic light-emitting diode may be referred to as a micro light-emitting diode (LED).

According to embodiment with reference to FIGS. 4 to 9, although it is described that the first gate electrode G1 of the first transistor T1 may include the first capacitor plate CSE1 of the first capacitor Cst, in an embodiment, the first gate electrode G1 of the first transistor T1 may be formed separately from the first capacitor plate CSE1 of the first capacitor Cst.

Figure 10:
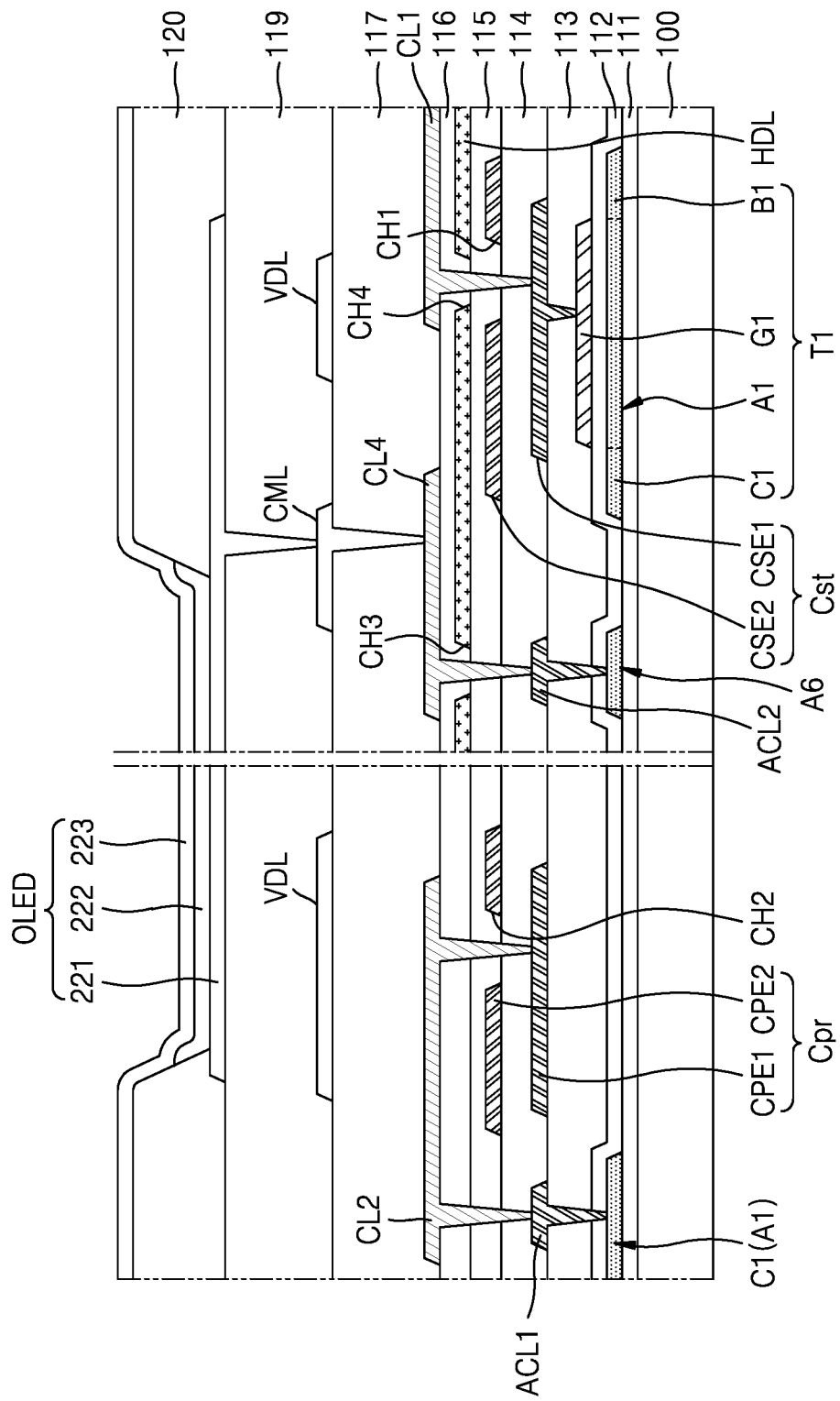
FIG. 10 is a schematic cross-sectional view of a display device according to an embodiment.

FIG. 10 is a schematic cross-sectional view of a display device according to an embodiment.

Referring to FIG. 10, the first gate electrode G1 of the first transistor T1 and the first capacitor plate CSE1 of the first capacitor Cst may be arranged or disposed on different layers. For example, the first gate electrode G1 of the first transistor T1 may be arranged or disposed on the gate insulating layer 112 and the first capacitor plate CSE1 of the first capacitor Cst may be arranged or disposed on the first interlayer insulating layer 113. The first capacitor plate CSE1 of the first capacitor Cst may be electrically connected to the first gate electrode G1 of the first transistor T1 through a contact hole of the first interlayer insulating layer 113.

The first capacitor Cst may include the first capacitor plate CSE1 and the second capacitor plate CSE2, and the second capacitor Cpr may include the third capacitor plate CPE1 and the fourth capacitor plate CPE2. A first intermediate insulating layer 114 may be arranged or disposed on the first and third capacitor plates CSE1 and CPE1, and a second intermediate insulating layer 115 may be arranged or disposed on the second and fourth capacitor plates CSE2 and CPE2.

Each of the first and second intermediate insulating layers 114 and 115 may include an inorganic insulating material such as silicon oxide, silicon oxynitride, and silicon nitride and may have a single-layered or multi-layered structure containing the aforementioned materials.

The horizontal power line HDL may be arranged or disposed on the second intermediate insulating layer 115, and the second interlayer insulating layer 116 may be arranged or disposed on the horizontal power line HDL. The first connection line CL1, the second connection line CL2, and the fourth connection line CL4 may be arranged or disposed on the second interlayer insulating layer 116, and the driving voltage line VDL and the connection metal layer CIVIL may be arranged or disposed on the first planarization insulating layer 117.

The first connection line CL1 may be electrically connected to the first capacitor plate CSE1 through the first hole CH1 of the second capacitor plate CSE2 and a fourth hole CH4 of the horizontal power line HDL. The second connection line CL2 may be electrically connected to the second high-concentration impurity region C2 of the first semiconductor layer A1 via a first auxiliary contact layer ACL1 and may be electrically connected to the third capacitor plate CPE1 through the second hole CH2. The pixel electrode 221 of FIG. 10 may be electrically connected to the fourth connection line CL4, and the fourth connection line CL4 may be electrically connected to the sixth semiconductor layer A6 via a second auxiliary contact layer ACL2. Other elements and structures of the light-emitting diode LED, for example, may be as described above with reference to FIG. 9.

According to the aforementioned embodiments, a size (or width) of the first hole CH1 of the second capacitor plate CSE2 of the first capacitor Cst may be formed differently from a size (or width) of the second hole CH2 of the fourth capacitor plate CPE2 of the second capacitor Cpr. For example, the size (or width) of the first hole CH1 of the second capacitor plate CSE2 of the first capacitor Cst may be formed smaller than the size (or width) of the second hole CH2 of the fourth capacitor plate CPE2 of the second capacitor Cpr. The pixel circuit having the aforementioned characteristics may minimize or prevent luminance changes of the display device and may minimize and prevent the generation of spots.

For example, according to the pixel circuit described with reference to FIG. 2, a voltage corresponding to a difference between a voltage of the driving power voltage ELVDD and a voltage of the aforementioned second node N2 may be stored in the first capacitor Cst, and the voltage stored in the first capacitor Cst may be affected by a value of CCpr/(CCst+CCpr). In a case that skew occurs according to process dispersion during formation of the pixel circuit as shown in FIG. 4, for example, each electrode, line, and capacitor plate may be formed to have a width smaller than an ideal width in a process of forming the electrodes, lines, and capacitor plates, CCpr/(CCst+CCpr) may fluctuate with the process dispersion, thereby causing luminance changes and/or generation of spots.

However, according to embodiments, because the size (or width) of the first hole CH1 of the second capacitor plate CSE2 of the first capacitor Cst may be formed differently from the size (or width) of the second hole CH2 of the fourth capacitor plate CPE2 of the second capacitor Cpr, the aforementioned issues may be prevented or minimized. For example, by forming the size (or width) of the second hole CH2 of the second capacitor Cpr having a relatively large capacitance larger than the size (or width) of the first hole CH1, CCpr/(CCst+CCpr) may be maintained relatively constant despite the occurrence of skew, thus minimizing the possibilities of luminance changes and generation of spots.

Figure 11:
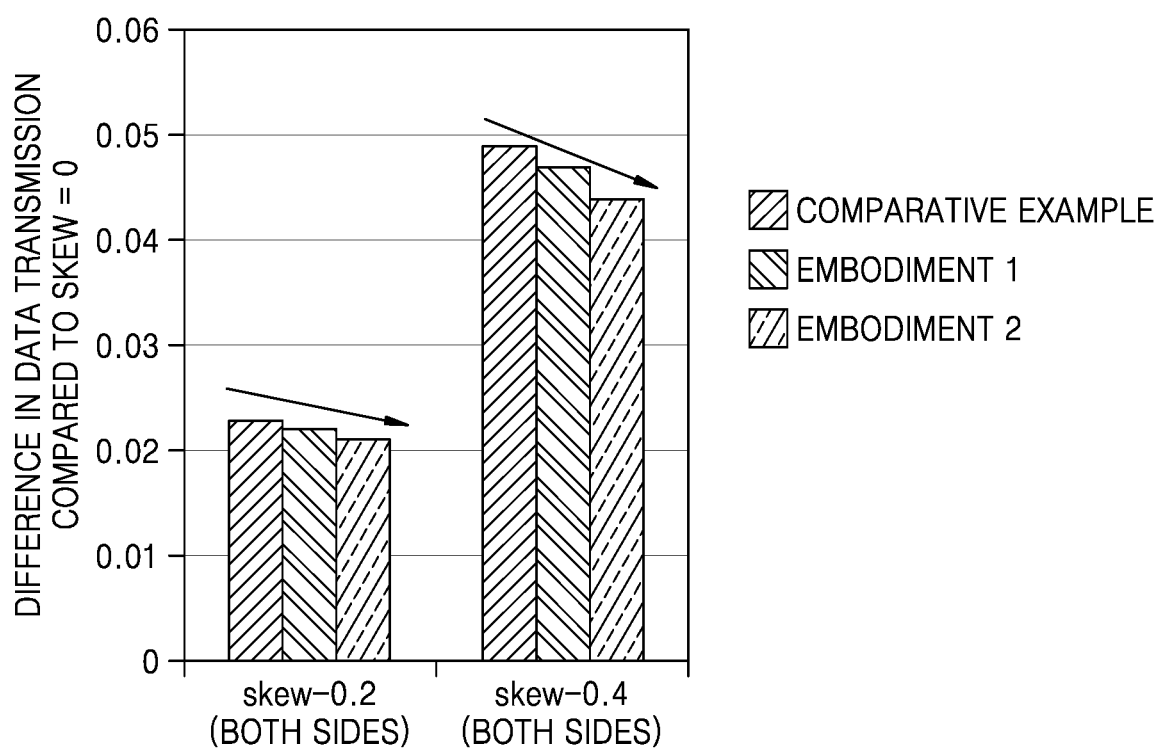
FIG. 11 is a graph of a difference in data transmission according to a first hole and a second hole.

FIG. 11 is a graph of a difference in data transmission according to the first hole CH1 and the second hole CH2. In FIG. 11, the Y-axis indicates a value of a difference in data transmission compared to a case where skew is 0 (zero), and the X-axis indicates a degree of skew. On the Y-axis, 0 indicates the case where skew is 0 (zero), and on the X-axis, skew-0.2 (both sides) indicates that a skew of about 0.2 μm occurs along a width direction, and skew-0.4 (both sides) indicates that a skew of about 0.4 μm occurs along the width direction.

In FIG. 11, a Comparative Example indicates a case where sizes of the first and second holes CH1 and CH2 are the same, Embodiment 1 indicates a case where the size, for example, a width, of the second hole CH2 is greater than a width of the first hole CH1 by 0.2 μm, and Embodiment 2 indicates a case where the size, for example, the width, of the second hole CH2 is greater than the width of the first hole CH1 by 0.4 μm.

Referring to FIG. 11, it may be shown that, in a case that skew is caused by a process, as the size of the second hole CH2 is greater than the size of the first hole CH1, the difference in data transmission gradually decreases compared to the case where skew is 0 (zero). For example, it may be shown that, as the size of the second hole CH2 is greater than the size of the first hole CH1, it becomes more similar to a case where the difference in data transmission is ideal. The gradually decreasing difference in data transmission compared to the case that skew is 0 (zero) means that luminance changes and/or generation of spots caused by process dispersion may be minimized. The display device according to an embodiment may provide high-quality images with the aforementioned advantages.

The display device according to embodiments may provide a pixel circuit suitable for high-speed driving, and may efficiently control luminance changes due to process dispersion of capacitors in a pixel circuit in which the capacitors may be provided. Therefore, the display device may display high-quality images.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a scan line extending in a first direction;

a data line and a driving voltage line each extending in a second direction;
a first transistor electrically connected to the driving voltage line and including a first gate electrode and a first semiconductor layer;
a second transistor electrically connected to the data line and the scan line and including a second gate electrode and a second semiconductor layer;
a first capacitor electrically connected to the first transistor and including a first capacitor plate and a second capacitor plate; and
a second capacitor including:
a third capacitor plate electrically connected to the first transistor; and
a fourth capacitor plate electrically connected to the second transistor, wherein
the second capacitor plate includes a first hole overlapping the first capacitor plate,
the fourth capacitor plate includes a second hole overlapping the third capacitor plate, and
a size of the second hole of the fourth capacitor plate is different from a size of the first hole of the second capacitor plate.

2. The display device of claim 1, wherein the size of the second hole of the fourth capacitor plate is greater than the size of the first hole of the second capacitor plate.

3. The display device of claim 1, wherein the third capacitor plate includes an isolated pattern.

4. The display device of claim 3, further comprising a first connection line electrically connecting the third capacitor plate and the first transistor,
wherein the first connection line is electrically connected to the third capacitor plate through the second hole of the fourth capacitor plate.

5. The display device of claim 1, wherein
the third capacitor plate is electrically connected to one of a source region and a drain region of the first semiconductor layer of the first transistor, and
the fourth capacitor plate is electrically connected to one of a source region and a drain region of the second semiconductor layer of the second transistor.

6. The display device of claim 1, wherein the fourth capacitor plate includes an isolated pattern.

7. The display device of claim 6, further comprising a second connection line electrically connecting the fourth capacitor plate and the second transistor.

8. The display device of claim 1, wherein the first capacitor plate includes an isolated pattern.

9. The display device of claim 8, further comprising:
a third transistor electrically connected to the first transistor; and
a third connection line electrically connecting the first capacitor and the third transistor.

10. The display device of claim 9, wherein the third connection line is electrically connected to the first capacitor plate through the first hole of the second capacitor plate.

11. The display device of claim 1, wherein the first capacitor plate includes the first gate electrode of the first transistor.

12. The display device of claim 1, further comprising:
a fourth transistor electrically connected to the second capacitor and the second transistor; and
a reference voltage line extending in the second direction and electrically connected to the fourth transistor.

13. A display device comprising:
a scan line extending in a first direction;
a data line and a driving voltage line each extending in a second direction;
a first transistor electrically connected to the driving voltage line and including a first gate electrode and a first semiconductor layer;
a first capacitor electrically connected to the first transistor and including a first capacitor plate and a second capacitor plate;
a second transistor electrically connected to the data line and the scan line and including a second gate electrode and a second semiconductor layer; and
a second capacitor electrically connected to the first transistor and the second transistor and including a third capacitor plate and a fourth capacitor plate, wherein
the first capacitor and the second capacitor are spaced apart from each other,
the second capacitor plate includes a first hole overlapping the first capacitor plate,
the fourth capacitor plate includes a second hole overlapping the third capacitor plate, and
a size of the second hole of the fourth capacitor plate is different from a size of the first hole of the second capacitor plate.

14. The display device of claim 13, wherein the size of the second hole of the fourth capacitor plate is greater than the size of the first hole of the second capacitor plate.

15. The display device of claim 13, wherein
the third capacitor plate is electrically connected to one of a source region and a drain region of the first semiconductor layer of the first transistor, and
the fourth capacitor plate is electrically connected to one of a source region and a drain region of the second semiconductor layer of the second transistor.

16. The display device of claim 15, further comprising a first connection line electrically connecting the second capacitor and the first transistor,
wherein the first connection line is electrically connected to the third capacitor plate through the second hole of the fourth capacitor plate.

17. The display device of claim 15, wherein the third capacitor plate includes an isolated pattern.

18. The display device of claim 16, further comprising a second connection line electrically connecting the fourth capacitor plate of the second capacitor and the second transistor.

19. The display device of claim 13, further comprising:
a third transistor electrically connected to the first transistor; and
a third connection line electrically connecting the first capacitor and the third transistor,
wherein the third connection line is electrically connected to the first capacitor plate through the first hole of the second capacitor plate.

20. The display device of claim 19, wherein the first capacitor plate includes an isolated pattern.

21. The display device of claim 13, wherein the first capacitor plate includes the first gate electrode of the first transistor.

22. The display device of claim 13, further comprising:
a fourth transistor electrically connected to the second capacitor and the second transistor; and
a reference voltage line extending in the second direction and electrically connected to the fourth transistor.

* * * * *